(12) United States Patent
Dzombak et al.

(10) Patent No.: US 6,526,359 B1
(45) Date of Patent: Feb. 25, 2003

(54) APPARATUS AND METHOD FOR MEASURING SMALL INCREASES IN MACHINE TOOL DRIVE MOTOR POWER

(75) Inventors: Ivan Dzombak, Pinckney, MI (US); William A. Kline, Ann Arbor, MI (US)

(73) Assignee: Growth Financial AG, Zurich (CH)

( * ) Notice: Subject to any disclaimer, the term of this patent is extended or adjusted under 35 U.S.C. 154(b) by 0 days.

(21) Appl. No.: 09/458,306

(22) Filed: Dec. 10, 1999

(51) Int. Cl.[7] .................. G01R 21/00; G01R 21/06; G06F 19/00
(52) U.S. Cl. ............................. 702/60; 702/61
(58) Field of Search ..................... 702/60, 61, 190, 702/197; 324/139

(56) References Cited

U.S. PATENT DOCUMENTS

| | | | |
|---|---|---|---|
| 3,839,628 A | * 10/1974 | Higgens et al. ......... 235/151.3 |
| 4,351,029 A | * 9/1982 | Maxey et al. ............... 364/511 |
| 4,764,720 A | 8/1988 | Nystrom ..................... 324/107 |
| 4,839,819 A | 6/1989 | Begin et al. ................. 702/92 |
| 4,989,155 A | 1/1991 | Begin et al. ................. 702/62 |
| 5,003,252 A | 3/1991 | Nystrom ..................... 324/772 |
| 5,467,012 A | 11/1995 | Nystrom ..................... 324/74 |
| 5,548,209 A | * 8/1996 | Lusignan et al. ........... 324/142 |
| 5,754,421 A | 5/1998 | Nystrom ..................... 363/155 |
| 5,871,509 A | * 2/1999 | Noren .......................... 607/9 |
| 5,930,092 A | 7/1999 | Nystrom ..................... 361/30 |
| 6,160,444 A | * 12/2000 | Horsfall et al. ............ 329/325 |
| 6,260,427 B1 | * 7/2001 | Jones et al. ................ 73/865.9 |

* cited by examiner

*Primary Examiner*—Marc S. Hoff
*Assistant Examiner*—Paul Kim
(74) *Attorney, Agent, or Firm*—Young & Basile, PC

(57) ABSTRACT

An apparatus and method for measuring the electrical load on a motor driven tool operating in a cycle having idle and cutting or machining states. The electrical power is continuously measured and an average power value is established during the idle state of at least one cycle and used as an offset subtracted from the measured electrical power values to generate an output proportional to the incremental power drawn by the cutting tool during the cutting state. The offset value is recalculated at the start of each new cycle and/or just prior to the commencement of a cutting operation by a tool. At least one filter and/or an amplifier are used to improve the signal-to-noise ratio of the output signal.

15 Claims, 3 Drawing Sheets

APPARATUS AND METHOD FOR MEASURING SMALL INCREASES IN MACHINE TOOL DRIVE MOTOR POWER

BACKGROUND OF THE INVENTION

1. Field of the Invention

The present invention relates, in general, to apparatus for measuring electrical energy and, more particularly, to apparatus and methods for monitoring power drawn by an electrical load.

2. Description of the Art

Various control devices have been developed to measure electrical power drawn by an electrical load, such as a motor driven spindle or axis drive in a machine tool. Particularly, control devices have been devised for measuring the spindle or axis drive power of three-phase AC motors.

Such power sensors measure or sense the motor's power rather than current due to the linear relationship between the change in motor load and the change in motor power which is generally proportional. So by measuring changes in the power consumption of a machine's motor, a power measurement device or sensor can provide an output signal that is extremely sensitive to machine conditions. The output signal can be communicated to a controller or intelligent tool monitor which can process the analog output signal of the power sensor to detect tool wear, a missing tool, a misplaced part, loss of load or overload.

For example, Montronix, Inc. of Ann Arbor, Mich., sells a PS100 Power Sensor for measuring spindle or axis drive power of an electric motor. Three Hall effect sensors are used to measure the current drawn by each phase of the electric motor. The analog output signals from the Hall effect sensors are combined with a voltage measurement from each supply phase to generate a DC voltage signal (the "total power signal") that is proportional to the total power being consumed by the motor being driven. The power measurement range of the sensor is determined by plug-in range adjustment modules.

However, a problem is encountered when measuring the power drawn by the motor for light loads typically associated with small tools, such as small diameter drill bits on the order of ⅛ inch diameter or smaller, for example. The low power levels drawn by the tool during the cutting or tool operation phase are typically much lower than the power drawn by the machine drive motor at idle. In such situations, the power sensor is incapable of distinguishing between the idle power drawn by the machine tool drive motor or the power drawn by the machine tool motor during a machining operation.

In an attempt to address this problem in obtaining accurate power measurements for small tools, Montronix, Inc. developed and sells an analog gain module, sold under the product name "PS100 Gain Module" which is plugged into a multi-pin connector provided on the PS100 Power Sensor described above. This analog gain module includes a selectable voltage offset of 1, 2, 3 or 4 volts and switch selectable, fixed gains of 2 or 4. The use of the offset was an attempt to compensate for the idle power drawn by the machine motor.

However, while this analog gain module, in certain situations, is able to successfully monitor the power drawn by small loads, such as those associated with small tools, the offset has to be established for each different tool. The gain also has to be selected for each new tool. However, if the offset and/or the gain are set improperly, output power readings could be off of the measurement scale, thereby providing useless power measurement.

It is also known that the idle and working power drawn by a motor driven tool will vary as the tool wears, ambient temperature changes, etc. This makes the preselection of the offset and gain difficult as the idle and cutting load power may vary throughout any given time period. Further, the installation of a new tool, such a new drill bit, in a given machine has different RPM and loads during cutting, again requiring a re-selection of the offset and gain values.

Thus, it would be desirable to provide a power sensor or monitor which is capable of accurately measuring power drawn by a drive motor operating small tools. It would also be desirable to provide a power sensor capable of accurately measuring power drawn by a motor drive operating small tools which can be easily used with existing tool power monitoring systems.

SUMMARY OF THE INVENTION

A method according to the present invention is disclosed for measuring the power load of a cutting tool on a drive motor operating the cutting tool in a cutting or operating cycle having idle and machining or cutting states, the method comprising the steps of:

measuring the electrical power load on the motor continuously during one complete cycle; and offsetting the measured electrical power values during the machining state with the measured electrical power values during the idle state to generate an output signal proportional to the power consumed only by the cutting process.

In another aspect of the invention, the present method offsets the measured power value by establishing an average power value during the idle state of the cutting cycle.

In yet another aspect, the method includes the steps of measuring the electrical power values in a setting period during the idle state of the cutting cycle, accumulating all of the power values during the time period, and determining the average electrical power value over the reset time period.

Typically, the offset value is measured and averaged each time a different machining operation is begun. Preferably, this occurs after the machine tool motor has reached cutting speed and stabilized, but before the particular tool has begun cutting.

In yet another aspect, a filter is employed to smooth out noise in the raw power signal. Another filter is employed to smooth out noise in the output signal.

In another aspect, the method includes the step of setting a variable selectable gain to a multiplier. The gain is selectable between 2 and 800X, for example. The filters and selectable gain, individually and in combination, vastly improve the signal-to-noise ratio of the output signal which makes the difference between a useful and a useless power measurement system.

In another aspect of the inventive method, the measured power is input to a time-domain averaging means which accumulates the power input signals and averages the signals to compute a new average offset value. This time-domain averaging feature uniquely enables a new offset value to be calculated at any time, such as at the start of each machining cycle or whenever a different tool is used within a machining cycle.

In another aspect of the invention, an apparatus is disclosed for measuring the electrical power load drawn by a machine tool drive motor in a cutting operation or cycle including idle and machining or cutting states. The apparatus includes means for receiving the measured power load on the motor continuously during one cutting cycle, means for calculating an offset value corresponding to the measured power value during the idle state of the cutting cycle, and means for outputting power values proportional to the electrical power consumed during the cutting process wherein the output power values are offset from or have the offset value subtracted from the aggregate power.

According to another aspect of the present invention, the means for calculating the offset value establishes an average power value during the idle state of the cutting cycle. Specifically, the calculating means includes means for measuring the electrical power values in an averaging period during the idle state, means for accumulating all of the power values during the averaging period, and means for determining the average electrical power value over the averaging period.

According to another aspect of the present invention, the apparatus includes a filter which smooths out noise in the raw power signal. Another filter is employed to smooth out noise in the output signal.

According to another aspect of the invention, the apparatus includes a variable selectable gain which is selectable between 2 and 800X, for example.

The present invention overcomes several deficiencies found in prior art power measurement devices used to measure the electrical power or load on a motor driven machine tool or other electrical device. The present power measurement or sensor apparatus precisely measures the very small increase in motor power consumption resulting from the cutting action of small tools. These small increases in power consumption have heretofore been masked by the normal idle power drawn by the motor. The present power gain apparatus uniquely calculates an offset corresponding to the average idle power at each use of a different tool or, alternately, at the start of each machining cycle, thereby accommodating tool wear, ambient temperature changes, etc. The offset is subtracted from the aggregate power measurement to yield an output signal proportional to the incremental power drawn by the cutting tool. The apparatus of the present invention is easily connectable to existing power sensors thereby enabling its use in a large number of existing applications as well as in new applications.

The use of the filter(s) and the selectable gain, individually or in combination, vastly improves the signal-to-noise ratio of the output signal which can make the difference between a useful power measurement system and a useless one.

The power measurement apparatus of the present invention may be uniquely mounted at the location of the power sensor itself. This enables the apparatus to process signals before transmission to a remote location as in prior art power measurement apparatus thereby improving the sensitivity, or signal-to-noise ratio, of the power measurement.

BRIEF DESCRIPTION OF THE DRAWING

The various features, advantages and other uses of the present invention will become more apparent by referring to the following detailed description and drawing in which.

DESCRIPTION OF THE PREFERRED EMBODIMENT

Figure 1:
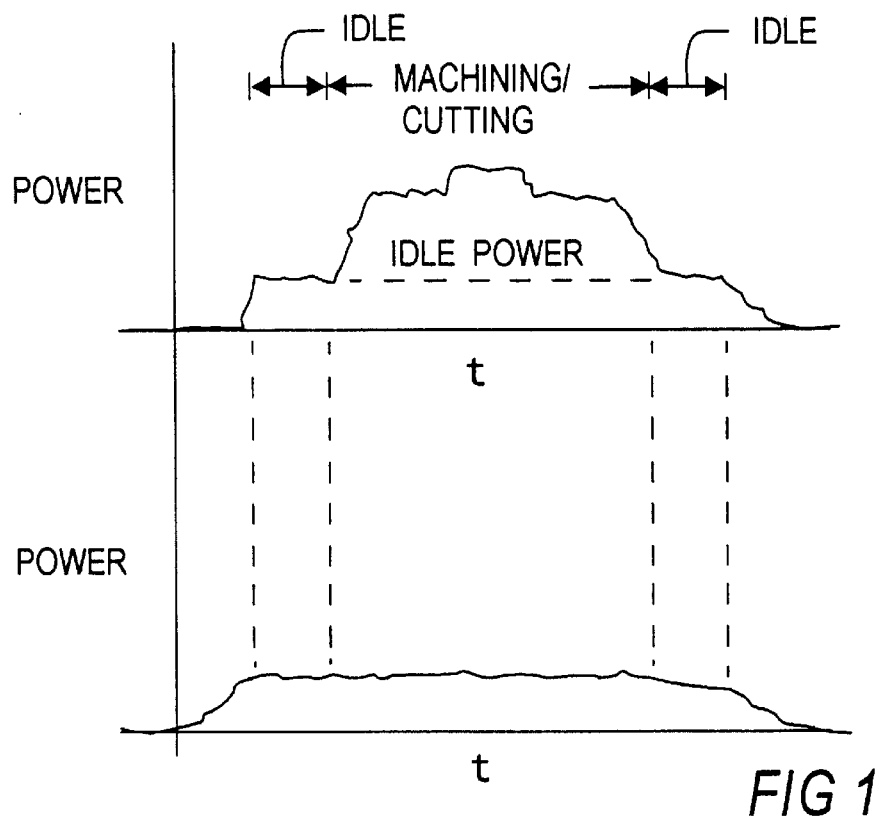
FIG. 1 is a graphical representation of power versus time in a single motor driven cutting cycle for a large tool and a small tool.

Referring now to the drawing, and to FIG. 1 in particular, there is depicted a graph of power versus time for a single cutting operation, such as the power drawn by a drive motor associated with a drill press operating a drill bit. The upper waveform in FIG. 1 depicts the power drawn by the motor during idle and cutting states in one cutting cycle for a large tool, such as a ½ inch diameter drill bit. As clearly shown in FIG. 1, the power or load drawn by the motor during the cutting state is significantly higher than the load drawn during the idle state. However, the load drawn by the motor during a cutting operation, such as a drilling operation, using a small tool, i.e., ⅛ inch drill bit, as shown by the lower waveform, is much less or only slightly higher than the power drawn by the motor itself during the idle state.

Prior art power sensors are not able to differentiate between the motor idle power and the power drawn by the motor during a cutting or machining operation using a small tool.

Figure 2:
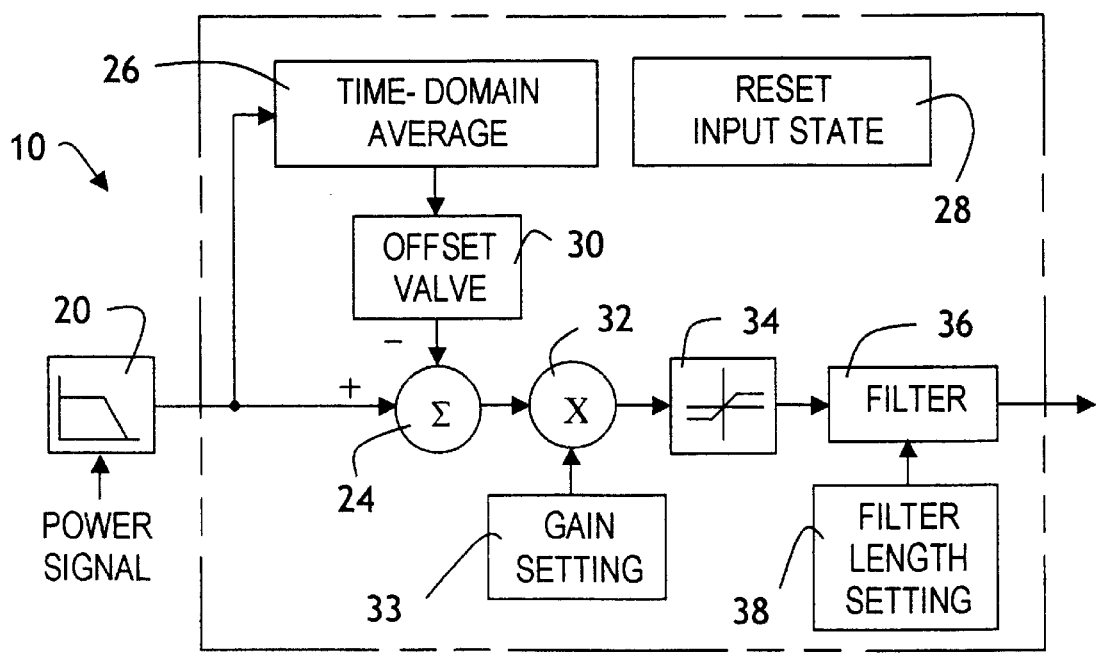
FIG. 2 is a control diagram depicting the general construction of an enhanced power sensor according to the present invention.

FIG. 2 depicts the general control flow sequence and circuitry of an enhanced power sensor measurement apparatus or circuit 10 according the present invention. The apparatus 10 is preferably in the form of a small module or printed circuit board having opposed pin sets which are plugged into pin connectors 12 and 14 which are mounted in an existing, prior art power sensor device, such as a PS100 Power Sensor sold by Montronix, Inc., which is also the assignee of the present invention. The pin connectors 12 and 14 and the pins extending from the power sensor circuit 10 provide DC power through the connector 12 to the enhanced power sensor circuit 10 as well as a raw analog power signal through the connector 14 as measured by the power sensor circuit of the power sensor.

It will be understood that the power sensor employed to measure the power drawn by one or up to three phases of a motor does not form the inventive part of the present power sensor apparatus 10. Thus, the details of the power sensor described above will be mentioned only where necessary to provide interconnection between the power sensor and the power sensor apparatus 10 of the present invention.

Figure 3:
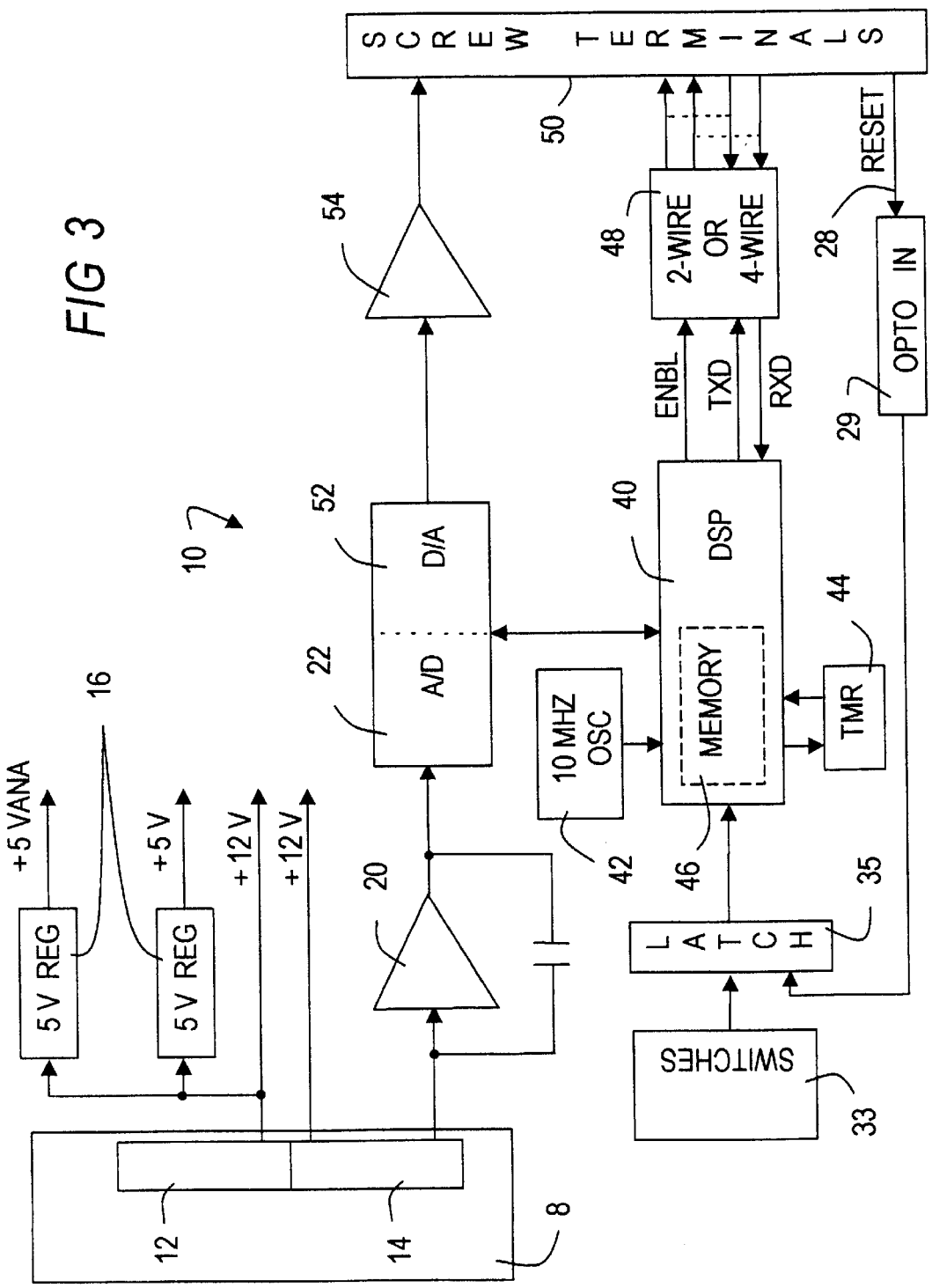
FIG. 3 is a detailed block diagram of a digital implementation of the enhanced power sensor according to FIG. 2.

As shown in FIG. 3, the power sensor 8 provides, by example only, plus and minus 12 volt power DC to the power sensor circuitry 10. The DC supply is also connected to 5 volt voltage regulators 16 which respectively provide +5VANA and +5V signals to the digital enhanced power sensor apparatus 10 circuitry.

A filter 20 receives the raw analog output signal from the power sensor 8 and removes high-frequency components from the analog power signal to avoid aliasing during the subsequent sampling operation. Preferably, by example only, the filter 20 is a low-pass filter having a cutoff frequency of about 40 Hz.

The output of the filter 20 is connected as one input to a summer 24 as well as to a time-domain averaging means 26, as shown in FIG. 2. An input from an external controller or the machine tool control provides a reset signal 28 to the enhanced power sensor apparatus 10. The reset signal 28 is activated during the motor idling stage just prior to the start of cutting. This reset signal 28 establishes a time period, such as a ½ second interval, in the total idle stage shown in FIG. 1 during which the outputs of the sampled analog power input signals from the filter 20 are accumulated and averaged by the time-domain average circuit means 26 to compute a new average offset value 30 which forms the second input to the summer 24. After the reset signal 28 is deactivated, the average offset value remains fixed until the reset input is activated again.

This time-domain averaging feature is a unique aspect of the present enhanced power sensor apparatus 10 since the reset signal 28 can be activated at any time, such as at the start of each machine cycle or just prior to commencement of cutting with a particular tool during a single machine cycle. The time-domain average of the sampled analog power signal is computed while the reset input is activated, and provides an accurate estimate of the true idle power level, assuming that the reset signal is timed properly to occur during the motor idling period(s) of the machine cycle.

As described above, the computed offset value 30 is subtracted by a summer 24 from the filtered actual power during the entire machine cycle, including both idle and operative or machining states. For the purpose of decreasing the system response time, the current estimate of the offset value 30 is continuously subtracted from the output of the filter 20, including the period during which the time-domain averaging process occurs. When the reset signal 28 is activated, the system output quickly approaches the final output value, and the offset estimate 30 is improved while the reset signal 28 remains active. The output of the summer 24, then, is a value proportional to the incremental power consumed by cutting process over and above the idle power consumption of the drive motor.

The output of the summer 24 is multiplied in multiplier 32 by a variably selectable gain which can be from 2 to 800X. Despite the amount of gain selected for the multiplier 32, the output of the multiplier 32 is limited by a limiter 34 which limits the maximum output to a preset magnitude, such as ±10 volts.

The output of the multiplier 32, after passing through the limiter 34, is processed by a low-pass or median filter 36 which removes noise from the output signal before supplying the signal as an output. The median filter is a statistical filtering technique unique to digital signal processing, which uses a variable-length window covering a set number of samples. The length of the filter window is a selectable input 38, such as a switch providing 25 or 50 samples in each window.

Although the summer 24, time-domain averaging means 26, the multiplier 32, the limiter 34 and the filter 36 may be implemented as electronic elements in circuitry, in a preferred example of the present power sensor apparatus 10, such features or elements are provided in a software program executed by a suitable general purpose processing unit or digital signal processor 40 shown in FIG. 3.

As will be described hereafter, FIG. 3 also depicts a digital implementation of the power sensor apparatus 10 of the present invention. In this aspect of the invention, the digital signal processor (or DSP) 40 receives a clock input from a 10 MHZ oscillator 42 as well as an input from a reset watchdog timer signal 44. The watchdog timer 44 provides a reset function to automatically restart the processor 40 in the event that normal processing is disrupted.

The DSP 40 communicates with a memory 46, such as a flash EPROM, which contains the stored control program executed by the DSP 40.

The output of the filter 20 is connected to an analog-to-digital converter means which is preferably a 16-bit A/D converter 22. The A/D converter 22 samples the input analog power signal from the filter 20 at a high rate and converts each sampled analog power level to a digital value which is proportional to the input signal.

The output of the A/D converter 22 is input to the DSP 40 for summation and gain adjustment as described above.

The gain is set by gain setting switches 33 which may be dip-type switches mounted on a printed circuit board containing the other components of the power sensor apparatus 10. Alternately, the gain may be set dynamically with a command received from an external agent via a serial communication port 48.

By way of example only, six switches 33 are provided and establish a binary code which is latched by a latch circuit 35 and read by the DSP 40. The six switches 33 establish a binary code which the DSP 40 utilizes to access a lookup table containing gain setting values which are then used by the DSP 40 as an input to the multiplier 32.

Various outputs may be provided by the power sensor apparatus 10. In one aspect, the DSP 40 communicates via transmit, receive and enable signals with a two-wire or four-wire RS485 or RS232 communication circuit 48, the output of which circuit 48 is connected to input and output terminals 50 mounted on the printed circuit board of the power sensor apparatus 10. The digital values provided by the DSP 40 which are proportional to the measured analog power signal are transmitted in RS485 or RS232 format to an external controller, not shown, such as a Montronix TS50 or TS100 Intelligent Tool Monitor which is capable of processing the digital signal to take corrective action, if necessary, in the event of excess power demand, a broken or excessively worn tool, etc.

Alternately, as shown in FIGS. 2 and 3, the DSP 40 is capable of transmitting the digital power signal from the filter 36 via a serial link to a 16-bit digital-to-analog converter 52. The output of the D/A converter 52 passes through an amplifier 54 preferably having a gain of three to provide an output signal range between 0 and 10 volts which is applied to one of the terminals 50. This provides an analog voltage output proportional to the processed power signal.

Separate pins, not shown in drawing, may be employed to provide a separate input for downloading the software control program to the memory 46 as well as to set up the various parameters of the power sensor apparatus 10.

Figure 4A:
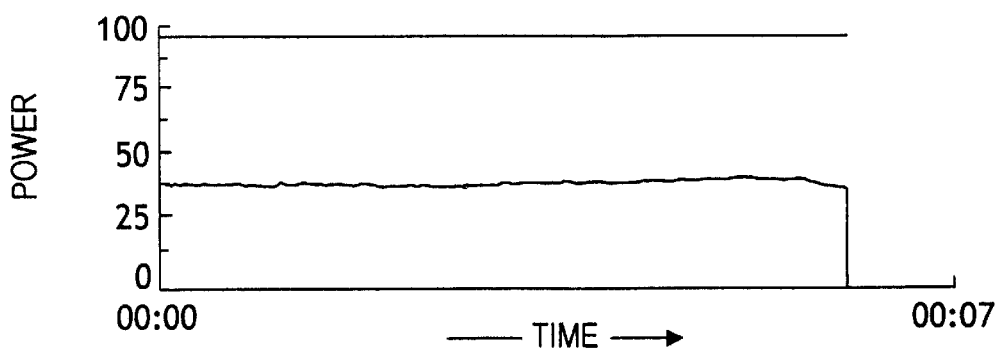
FIGS. 4A and 4B are graphs depicting the power consumed by a motor operating a small tool without the present invention in FIG. 4A, and with the features of the present invention in FIG. 4B.

Referring now to FIG. 4A, there is depicted a graph of the power consumed by a machine drive motor over a complete cutting cycle which does not use the features of the present invention. The relatively straight upper line on the graph depicts the magnitude of the average power consumed by the motor under idle conditions. The small irregularities or bumps in the top line are small increases in power consumption due to actual cutting by a small diameter tool. As clearly shown in FIG. 4A, the idle power level masks substantially all of the actual power consumed by the small tool.

Figure 4B:
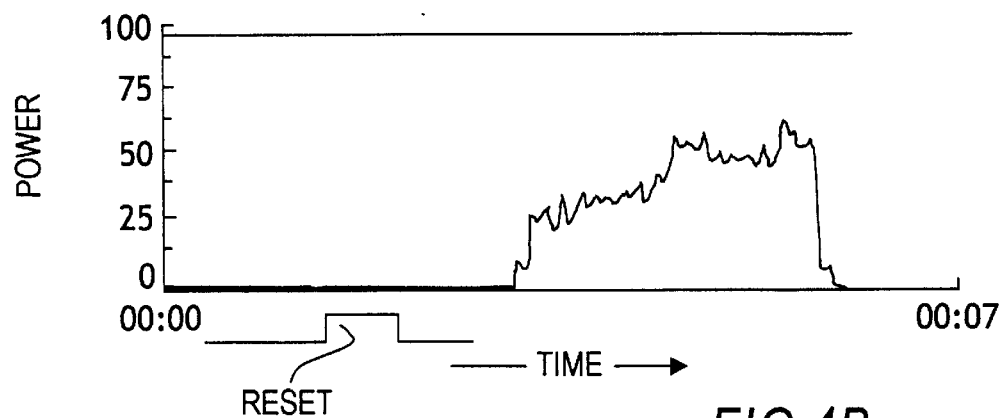

However, the features of the present invention are clearly seen in FIG. 4B wherein the idle power has been offset or removed from the power determination thereby providing an output signal which is proportional only to the actual power consumed by the motor during the cutting operation by a small diameter tool. FIG. 4B also shows the time position of the reset signal wherein the idle power is determined for use in the offset calculation of the present invention.

Figure 5:
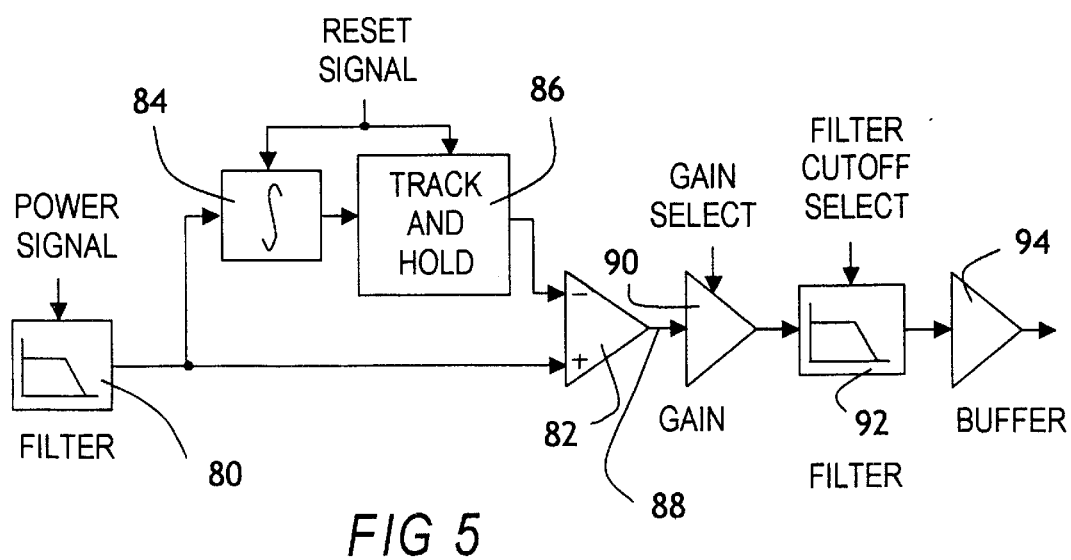
FIG. 5 is a block diagram showing an analog implementation of the enhanced power sensor according to the present invention.

An analog implementation of the apparatus and method of the present invention is illustrated in FIG. 5 in block diagram form. The power signal from the machine motor is still passed through a low-pass filter 80. The output of the filter 80 is split and applied to a positive input of a differential amplifier 82 and to an integrator 84. The integrator 84 functions, as is well known, to sum all of the power readings during a set period established by the duration of the reset signal. The output of the integrator 84 is supplied as an input to a track and hold circuit 86. In operation, the track and hold circuit 86 stores a voltage in a capacitor at the end of the reset signal or period which is proportional to the sum of all the power signals collected during the reset signal period.

The output of the track and hold circuit 86 is connected to the negative input of the differential amplifier 82. Thus, the output of the amplifier 82 is the difference between the two input signals, with the power consumed during the reset period subtracted as an offset from the power signal input, thereby offsetting the power determined during the reset period from the total measured power, leaving an output signal 88 from the amplifier 82 whose magnitude is proportional to the actual power consumption attributable to the cutting tool.

The output signal 88 is applied to a selectable gain circuit 90 which can have a selectable gain settable by external switches, an external signal or from a microcontroller via a serial port 48.

The output of the gain circuit 90 is passed through a low-pass filter 92 having a selectable cutoff select input. The output of the filter 92 is passed through a buffer 94 and forms the output of the present power gain sensor.

In summary, there has been disclosed a unique power sensor or measurement apparatus which is capable of providing very precise power measurement over the entire operating range of a machine tool and, specifically, at the low load range associated with small or lightweight tools. In addition, the power sensor apparatus of the present invention contains a unique offset compensation feature which automatically learns the idle power drawn by the motor during the idle stage of a machining cycle. This offset value is subtracted from the measured output power to provide a true measure of the power consumption attributable to the cutting tool.

This offset feature, in conjunction with the unique filtering and/or selectable gain of the present apparatus, either individually or in combination, vastly improves the signal-to-noise ratio of the output signal. The result is a much more precise and useful measurement of the small increase in motor power consumption resulting from the cutting action of small tools. These small increases in power consumption have not been readily measurable heretofore. The power gain apparatus of the present invention may also be easily coupled to existing power sensors to facilitate its use in a wide range of existing and/or new applications.

What is claimed is:

1. A method for measuring the electrical power drawn by a cutting tool drive motor in a single operating cycle having idle and cutting states, the method comprising the steps of:
   measuring the power load on the drive motor continuously during each idle and cutting state;
   offsetting the measured electrical power values during the cutting state with the measured power values during the idle state to yield the incremental power load attributable to the cutting tool on the motor during the cutting state;
   amplifying the incremental power load by a variably selectable gain between two and 800;
   setting the variably selectable gain by:
      providing a plurality of settable switches outputting a combined binary code to a processor; and,
      providing the processor accessing a lookup table containing gain values corresponding to the binary code defined by the plurality of switches; and
   filter the amplified incremental power load by a median filter to generate an output signal.

2. The method of claim 1 wherein the step of offsetting the measured electrical power values further comprises the step of:
   establishing an average power value during the idle state of each operating cycle.

3. The method of claim 1 wherein the offsetting step further comprises:
   measuring the electrical power values periodically over a predetermined time period during the idle state of the operating cycle;
   accumulating all of the sampled electrical power values during the time period; and
   determining the average electrical power value as an offset value over the time period.

4. The method of claim 3 wherein an offset value is calculated at least once for each operating cycle.

5. The method of claim 3 wherein an offset value is established once at the start of an operating cycle, and further including the step of:
   using the offset value for each subsequent machine cycle until a new offset value is requested.

6. The method of claim 1 further comprising the step of:
   filtering the measured power load before calculating the offset.

7. The method of claim 1 further comprising the steps of:
   filtering the measured power load;
   converting the filtered measured power load to digital values before calculating the offset.

8. The method of claim 7 further comprising the steps of:
   after filtering the amplified incremental power load, converting the digital values to analog values.

9. An apparatus for measuring the electric power load on a tool drive motor in a single operating cycle including idle and cutting states, the apparatus comprising;
   means for measuring the electrical power load on the motor continuously during one complete operating cycle;
   means for calculating an offset value corresponding to the measured electrical power during the idle state of the operating cycle;
   means for computing incremental power load adjusted by the offset value, attributable to the incremental load power drawn by the cutting tool during the cutting state;
   means for setting a variably selectable gain including:
      a plurality of settable switches outputting a combined binary code to a processor; and,
      the processor accessing a lookup table containing gain values corresponding to the binary code defined by the plurality of switches;
   means for amplifying the incremental power load by the variably selectable gain of between two and 800; and
   means for filtering the amplified incremental power load by a median filter to form an amplified output signal.

10. The apparatus of claim 9 further comprising:
   means for filtering the measured power signal, the output of the filtering means input to the calculating means.

11. The apparatus of claim 9 further comprising:

means for converting the measured electrical power values to digital values.

12. The apparatus of claim 11 wherein the converting means comprises an analog to digital converter.

13. The apparatus of claim 11 further comprising:

a processor executing a stored control program, the output of the analog to digital converter being input to the processor.

14. The apparatus of claim 11 further comprising:

a filter interposed between a power load input and the converting means.

15. The apparatus of claim 9 further comprising:

a limiter limiting the maximum and minimum output incremental power load values to predetermined maximum and minimum values.

* * * * *